United States Patent
Hong et al.

(10) Patent No.: US 9,824,737 B2
(45) Date of Patent: Nov. 21, 2017

(54) MEMORY CIRCUIT AND METHOD FOR OPERATING A FIRST AND A SECOND SET OF MEMORY CELLS IN DIRECT MEMORY ACCESS MODE WITH REFRESH

(71) Applicant: Intel IP Corporation, Santa Clara, CA (US)

(72) Inventors: Yang Hong, Ottobrunn (DE); Martin Ostermayr, Oberhaching (DE); El Mehdi Boujamaa, Grasse (FR)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/977,671

(22) Filed: Dec. 22, 2015

(65) Prior Publication Data

US 2017/0178707 A1  Jun. 22, 2017

(51) Int. Cl.
  *G11C 11/00* (2006.01)
  *G11C 11/16* (2006.01)
  *G11C 11/15* (2006.01)

(52) U.S. Cl.
  CPC .......... *G11C 11/1675* (2013.01); *G11C 11/15* (2013.01); *G11C 11/16* (2013.01)

(58) Field of Classification Search
  CPC .......... G11C 11/16; G11C 11/15; H01L 43/08

USPC .......... 365/158, 145, 222
See application file for complete search history.

(56) References Cited

U.S. PATENT DOCUMENTS

| | | | | |
|---|---|---|---|---|
| 6,445,636 | B1* | 9/2002 | Keeth | G11C 7/1042 365/222 |
| 2003/0065884 | A1* | 4/2003 | Lu | G06F 12/0893 711/118 |
| 2012/0139069 | A1* | 6/2012 | Kim | H01L 27/228 257/421 |
| 2014/0056052 | A1* | 2/2014 | Lee | G11C 13/0033 365/145 |
| 2016/0172029 | A1* | 6/2016 | Kern | G11C 13/0033 714/764 |

\* cited by examiner

*Primary Examiner* — Connie Yoha
(74) *Attorney, Agent, or Firm* — Thorpe North & Western, LLP; Todd B. Alder

(57) ABSTRACT

A memory circuit (100), comprises a first set of memory cells (102a; 202a) configured to operate in a direct access mode or in a refresh mode and a second set of memory cells (102b; 202b) configured to operate in the direct access mode and in the refresh mode. The memory circuit (100) further comprises a controller (104) configured to receive a write request and to execute the write request for a set of memory cells being in direct access mode; and to buffer the write request for later execution for a set of memory cells being in refresh mode.

19 Claims, 4 Drawing Sheets

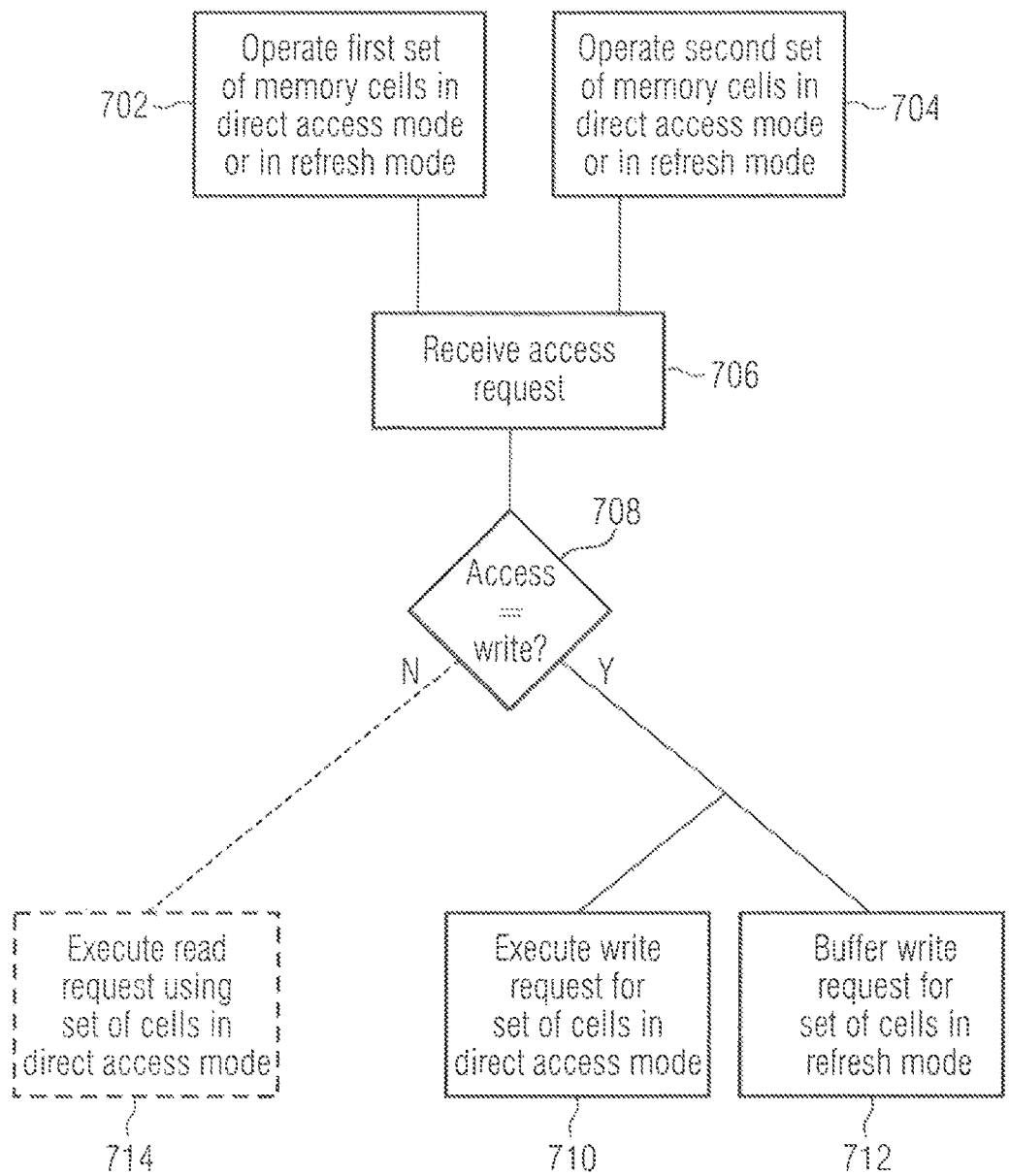

MEMORY CIRCUIT AND METHOD FOR OPERATING A FIRST AND A SECOND SET OF MEMORY CELLS IN DIRECT MEMORY ACCESS MODE WITH REFRESH

FIELD

Examples relate memory circuits and methods for operating a first and a second set of memory cells to store and read data.

BACKGROUND

Many applications require memory having quick access times, but at an expense of considerable energy consumption. Examples are cache memories within integrated circuits, central processing units or communication devices or modems, such as modems with 2G/3G/LTE support. Static RAM (SRAM) is fast and has short read and write access times (usually <1 ns) while the energy consumption or the leakage current required to maintain the stored information can be comparatively high. Other memories may have a lower leakage current but with longer read/write access times.

BRIEF DESCRIPTION OF THE FIGURES

Some embodiments of apparatuses and/or methods will be described in the following by way of example only, and with reference to the accompanying figures, in which

FIG. 7 illustrates a flowchart of an example of a method for operating a first set of memory cells and a second set of memory cells.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent", to name just a few examples).

The terminology used herein is for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art, unless expressly defined otherwise herein.

Figure 1:
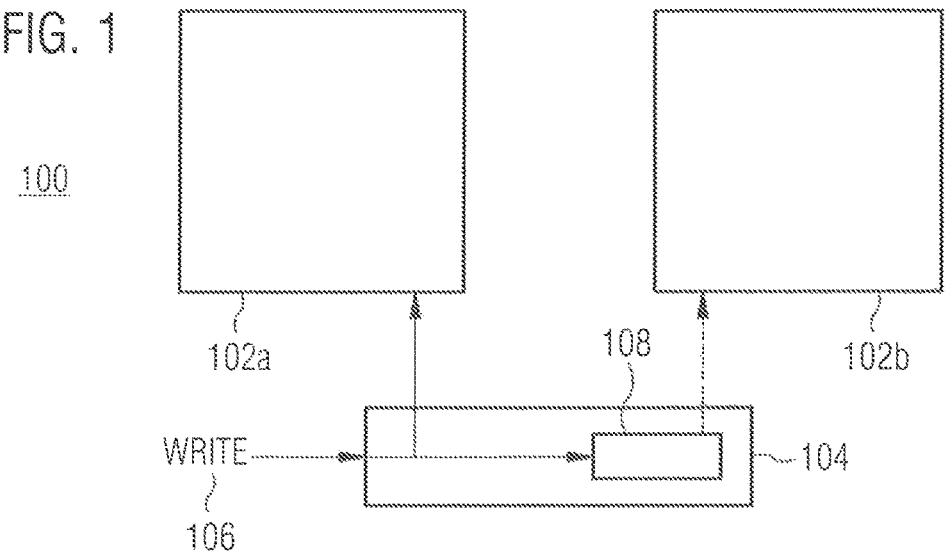
FIG. 1 illustrates an example of a memory circuit comprising a first set of memory cells and a second set of memory cells.

FIG. 1 illustrates an example of a memory circuit. The memory circuit comprises a first set of memory cells 102a as well as a second set of memory cells 102b. The first set of memory cells 102a is configured to operate in a direct access mode or in a refresh mode. Likewise, the second set of memory cells 102b is configured to operate in the direct access mode or in the refresh mode.

A controller 104 is configured to receive a write request 106 and to execute the write request for a set of memory cells being in direct access mode while the write request for a set of memory cells being in refresh mode is buffered for later execution. In FIG. 1, it is assumed that the first set of memory cells 102a is presently operated in the direct access mode, while the second set of memory cells 102b is operated in refresh mode. Therefore, the write request to the first set of memory cells 102a is directly executed and the data associated with the write request is written to the first set of memory cells 102a to be saved in the memory cells addressed within the request. At the same time, for the second set of memory cells 102b, the data associated with the write request 106 is buffered for later execution, i.e. for later writing to the second set of memory cells 102b. To this end, some examples of controllers may comprise a cache memory 108 as illustrated as an optional feature in FIG. 1.

If the controller is capable of buffering a write request for later execution for the set of memory cells presently being in refresh mode, slower memory cells within the first set and the second set may be used while providing a memory circuit having an overall performance that is better than the performance of the individual memory cells. In particular, a required refresh of the memory cells does not reduce the performance of the memory circuit, since the time required by a refresh can be completely hidden by the controller so that no additional wait cycles occur or are visible to the user of the memory circuit.

The refresh mode is repeated in time intervals depending on the performance of the memory cells used and on the particular implementation. While one set of memory cells is in refresh mode, the other set of memory cells operates in direct access mode so that data written to the memory circuit can be directly written to one of the sets of memory cells at any time. Likewise, if a read request occurs, the read request can be executed directly at any time by the set of memory cells operating in direct access mode without the need to access the set of memory cells operating in refresh mode.

The first set of memory cells and the second set of memory cells can be synchronized. To achieve this, for example, a cycle of a refresh mode comprises two periods: a reproduction period and an updating period. That is, a time interval used for the refresh mode is divided in a time interval used for a reproduction period for the stored content of the memory cells and in an updating period used to write data of the buffered write requests into the set of memory cells. In the reproduction period, the content stored in the memory cells is first read out and then rewritten to the memory cells in order to avoid data loss due to the limited retention time of the memory cells. The frequency of refresh mode cycles required to maintain the already stored data depends on the memory type of the used memory cells and on the parameters used to operate the memory cells. If, for example, the memory cells can maintain the data for 100 ms before the data is lost due to intrinsic leakages or other properties of the memory cells, a refresh would have to occur at least ten times per second, i.e. the refresh frequency would be 10 Hz. Because refreshing requires a read operation and a subsequent write operation for each memory cell, refreshing a set of memory cells may consume a considerable amount of time.

However, the time consumed by the refresh of a set of memory cells does not reduce the performance of an example of a memory circuit of FIG. 1, because another set of memory cells is in the direct access mode at the very same time so that both, read and write requests can be performed by the memory circuit at any time without having to accept wait cycles or interruptions caused by refreshing. In order to maintain synchronization, a cycle during which a set of memory cells is operated in refresh mode not only comprises the reproduction period but also the updating period. Within the updating period, the data of the write requests buffered by the controller is written to the addressed memory cells. After each cycle of the refresh mode, the first set of memory cells and the second set of memory cells are in synchronization with one another.

The examples described herein constitute a memory circuit wherein required refresh cycles are hidden to a user of a memory circuit which, in turn, may allow use of memory cells having read/write times which would otherwise cause inappropriately long refresh-induced delays.

The refresh mode may only use a small fraction of the retention time of the memory cells. Therefore, in some examples, the first set of memory cells and the second set of memory cells simultaneously operate in direct access mode for a considerable amount of the retention time. This, in turn, may allow to use fewer memory cells for a cache memory 108 than the memory cells within the first set of memory cells 102a or the second set of memory cells 102b. The cache memory only needs to be able to buffer the maximum amount of write requests or the amount of data which is written during the time period of a refresh cycle. An area and cost overhead caused by the cache memory may therefore be maintained low so that, depending on the memory technology chosen, an overall area consumption of an example of a memory circuit may be lower than the area consumption of another memory technique intrinsically providing for comparable access times.

According to some examples, the first set of memory cells is only operated in refresh mode when the second set of memory cells operates in direct access mode, and vice-versa. Hence, the second set of memory cells is configured to only operate in refresh mode when the first set of memory cells operates in direct access mode. In other words, the first set of memory cells is configured to operate in direct access mode when the second set of memory cells operates in refresh mode and the second set of memory cells is configured to operate in direct access mode when the first set of memory cells operates in refresh mode.

According to some examples, the updating period constitutes the end of the time interval used for the refresh mode to finish the refresh mode with both sets of memory cells being in full synchronization. According to some examples, the controller is configured to execute a write request at a first write speed for a memory cell being in direct access mode, while a buffered write request within the updating period is executed at a second write speed which is higher than the first write speed. The memory cells of each set may be operated at different write speeds in the direct access mode and in the updating period of the refresh mode in order to be able to completely write the buffered data into the memory cells and to achieve full synchronization. While there may be additional write requests during the time of the refresh cycle having a reproduction period and updating period, the write speed during the updating period should be higher than the write speed in the direct access mode in order to enable the controller to completely synchronize the set of memory cells presently in refresh mode.

Figure 2:
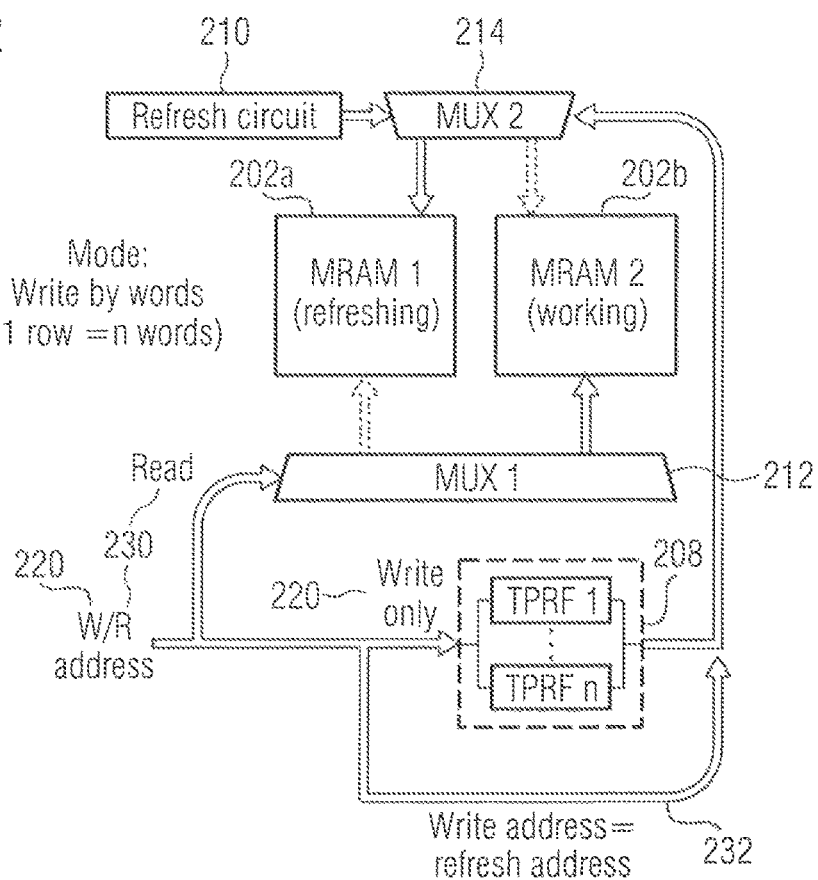
FIG. 2 illustrates a further example of a memory circuit comprising a first set of memory cells and a second set of memory cells and associated cache memory.

FIG. 2 illustrates an example of a memory circuit in more detail. Similar to the example of FIG. 1, the memory circuit comprises a first set of memory cells 202a and a second set of memory cells 202b. Without limitation, it is assumed that, for this particular example, the memory cells are magnetic random access memory cells (MRAM), for example of the design illustrated in FIG. 4. In another example, memory circuit includes dynamic volatile memory includes DRAM (dynamic random access memory), or some variant such as synchronous DRAM (SDRAM).

A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

Further examples may use other memory technologies, which are non-volatile in the sense that they are capable of storing data for a considerable amount of time before requiring a refresh. Further examples may use resistive random access memory (ReRAM), oxide-based resistive memory RAM devices (OxRRAM) or phase-change random access memory (PCM-RAM) to name some examples. In one embodiment, the non-volatile memory technologies include block addressable memory devices, such as NAND or NOR technologies. Thus, a memory technologies can also include a future generation non-volatile devices, such as a three dimensional crosspoint memory device, or other byte addressable nonvolatile memory devices, or memory devices that use chalcogenide phase change material (e.g., chalcogenide glass). In one embodiment, the memory technologies can be or include multi-threshold level NAND flash memory, NOR flash memory, single or multi-level Phase Change Memory (PCM), a resistive memory, nanowire memory, ferroelectric transistor random access memory (FeTRAM), spin transfer torque (STT)-MRAM, or a combination of any of the above, or other memory.

The example of FIG. 2 further comprises a refresh circuit 210, a first multiplexer 212 and a second multiplexer 214. The first set of memory cells 202a is configured to operate in the direct access mode or in the refresh mode. Likewise, the second set of memory cells 202b is configured to operate in the direct access mode or in the refresh mode.

Unlike in the example of FIG. 1, the example of FIG. 2 also illustrates how read requests are considered within the memory circuit. The operation of the memory circuit in the event of a write request 220 and in the event of a read request 230 are described subsequently. For the following explanation, it is assumed that the first set of memory cells 202a is presently operated in refresh mode while the second set of memory cells 202b is operated in direct access mode. When a read request 230 is received, the first multiplexer 212 is used to direct the read request to the second set of memory cells 202b, which are presently in direct access mode. The read request can so be directly executed and stored data be delivered to a user of the memory circuit. In the event of a write request 220, very much like for the read request, the write request is multiplexed by means of the first multiplexer 212 to the second set of memory cells 202b. That is, for the memory cells being in direct access mode, the write request is executed directly. For the first set of memory cells 202a presently being operated in refresh mode, the write request 220 is stored in a cache memory 208 for later execution. If, by chance, the write address corresponds to the address of a memory cell presently being refreshed, bypass 232 may be used to bypass the cache memory 208 in order to directly execute the write request 220 also for the first set of memory cells 202a. The bypass 232 can be optionally implemented in order to avoid unnecessary updating of the memory cells within the refresh mode. Cache memory 208 can be implemented as any memory device or technology.

In the example of FIG. 2, the functionality of the controller to receive a write request, to execute the write request for a set of memory cells being in direct access mode and to buffer the write request for later execution for a set of memory cells being in refresh mode is distributed amongst the refresh circuit 210, the first multiplexer 212, the second multiplexer 214, the cache memory 208 and an associated control logic. The control logic decides which of the sets of memory cells is presently used in refresh mode and controls the first multiplexer 212 and the second multiplexer 214 to directly execute the read and write requests for the sets of memory cells being in direct access mode. If a set of memory cells is to be operated in refresh mode, the control logic activates and controls the refresh circuit 210 and controls the second multiplexer 214 in order to give the refresh circuit 210 access to the respective set of memory cells. Likewise, the control logic controls the use of the cache memory 208 to store write requests for later execution. The functionality of the control logic may, for example, be described by a finite state machine. The algorithm performing the functionality of the control logic may, for example, be implemented in software within a general purpose CPU or in firmware to be used for a dedicated programmable device. Other examples may implement the functionality of the controller using dedicated hardware, for example a Digital Signal Processor (DSP).

Depending on the implementation, the control logic may reside anywhere within the memory circuit, as for example on the same die as the first set of memory cells 202a and the second set of memory cells 202b, or on a different die of the same chip. Embedding the control logic on the same die than the rest of the memory circuit may, however, reduce routing latencies and decrease associated costs.

Since the control logic controls the refresh circuit, the control logic is aware which cells (addresses) of a set of memory cells are presently being reproduced. If a write request is received for an address that is presently being reproduced, the control logic of the controller is capable to decide whether to use bypass 232 or whether to use cache memory 208 instead. Using bypass 232 saves the associated write within the updating period of the present refresh cycle and may serve to reduce the time required for the updating period.

Figure 3:
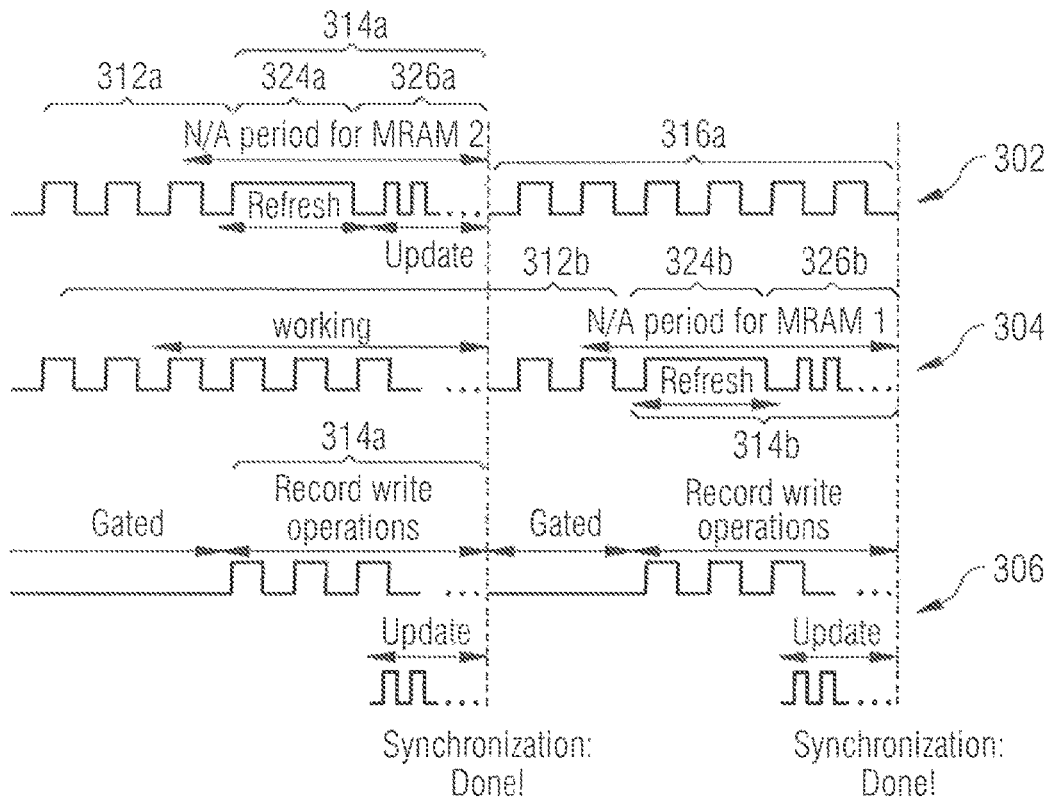
FIG. 3 illustrates timing diagrams for the memory cells of the memory circuits of FIG. 1 or FIG. 2.

As already mentioned before, the refresh mode comprises a reproduction period and an updating period in order to be able to be consistent and in synchronization with the set of memory cells presently operating in direct access mode after a refresh mode cycle. FIG. 3 illustrates the operation during direct access mode and during refresh mode in more detail, using timing diagrams. In FIG. 3, the first line 302 illustrates the operation modes of the first set of memory cells 202a, the second line 304 illustrates the operation modes for the second set of memory cells 202b and the third line 306 illustrates the operation modes for the cache memory 208 of FIG. 2. In particular, the first line illustrates the transition from direct access mode 312a to refresh mode 314a and the subsequent return to direct access mode 316a for the first set of memory cells 202a. Likewise, a transition from direct access mode 312b to refresh mode 314b is illustrated for the second set of memory cells 202b in the second line 304.

Refresh mode 314a comprises a reproduction period 324a in which the content of the memory cells is read out and rewritten into the memory cells in order to avoid data loss as well as an updating period 326a. During the updating period 326a, the buffered write requests are executed in order to synchronize the content of the two sets of memory cells with one another. In other words, the write requests received for the first set of memory cells 202a within the reproduction period 324a of refresh mode 314a are first buffered in cache memory 208 and the buffered write requests are executed during updating period 326a of refresh mode 314a. As illustrated in FIG. 2, write requests being directed to a memory cell presently being reproduced within the reproduction period may optionally be directly executed in order to avoid an additional write operation within the updating period 326a. Within the reproduction period 324a, the content of the memory cells is read out and subsequently written back to the very same memory cell it has been read out from. This is performed in order to reinitialize the memory cell with the previously stored content in order to start a new cycle during which the memory cell is capable of storing the data without a risk of data-loss (the memory cells retention time).

The second set of memory cells operates in direct access mode 312b while the first set of memory cells 202a operates in refresh mode 314a. After the first set of memory cells 202a returns to direct access mode 316a, the second set of memory cells 202b transits into refresh mode 314b, which is subdivided into a reproduction period 324b and an updating period 326b.

While the write speed during the reproduction period 324b within the refresh mode 314a may be chosen arbitrarily, the write speed at which the buffered write requests are executed within the updating period 326b is higher than the write speed at which write requests are executed during the direct access mode 312b. This enables synchronization of both sets of memory cells with each other in the event of continuously arriving write requests during the reproduction periods and updating periods. In other words, controllers according to examples described herein are configured to execute a write request at a first write speed for a memory cell being in direct access mode and at a second write speed for a buffered write request of a memory cell being in refresh mode, the first write speed being slower than the second write speed. According to some examples, there may be a third write speed used for the reproduction period. The third write speed may be slower than the first write speed, faster than the first write speed, equal to or even faster than the second write speed, according to the circumstances. In order to enable different write speeds, some examples may comprise at least two different clock circuits in order to generate two clock signals used to implement the differing write speeds. According to some examples, the sets of memory arrays may be alternatively clocked with different clock signals in order to enable the different write speeds.

As illustrated in the third line 306 of the FIG. 3, the cache memory only needs to operate during the refresh modes of operation of the first and second set of memory cells 202a and 202b. During the first refresh mode 314a the cache memory 208 continuously records the write requests for the first set of memory cells 202a. The cache memory records the write requests which are received at the first write speed. The first write speed is the write speed with which the memory circuit can be accessed. During the updating period 326a, the cache memory 208 may simultaneously be used for both storing the received write requests and providing the previously-stored write requests, as illustrated in FIG. 3. To this end, some examples use cache memory which is configured to or capable of simultaneously performing read and write operations. For example, Two-Port Register File (TPRF) memory cells may be used to achieve this goal. However, further implementations may also use other cache memory configurations that are not capable of simultaneously reading and storing information from and into the same array of memory cells.

While FIG. 2 illustrates a separate refresh circuit 210 performing the reproduction of the content of the memory cells during the reproduction period of the refresh mode, further embodiments can use a different architecture. For example, readout and rewriting of the memory cells within the reproduction period may also be performed using part of the cache memory 208. Likewise, the functionality described with respect to FIGS. 1 and 2 may also be distributed differently between functional elements or blocks of a memory circuit. For example, a single hardware entity or functional block may include all the functionality, as illustrated in FIG. 1. In the implementation of FIG. 2, however, the first multiplexer, the second multiplexer and the refresh circuit together with the associated control logic jointly implement the functionality of controller 104 of FIG. 1.

As again illustrated in FIG. 3, the refresh mode may be significantly shorter than the retention time during which the cells operate in direct access mode. To this end, there can be times where both, the first set of memory cells 202a and the second set of memory cells 202b simultaneously operate in direct access mode. During those times, write requests are directly executed by both sets of memory cells simultaneously, while read requests are selectively answered by one of the set of memory cells. According to some examples, the read requests may be answered by the set of memory cells having been refreshed a shorter time ago to reduce a risk of a false read result.

When the time needed for the refresh mode is significantly shorter than the time during which memory cells can be directly accessed, the cache memory capacity may be significantly smaller than that of the memory within the first set of memory cells 202a or the second set of memory cells 202b. This may allow using a smaller amount of cache memory serving a larger amount of first and second memory cells, which in turn decreases the memory and semiconductor area consumed by the cache memory. According to some examples, therefore, the cache memory configured to store the write requests for the first set of memory cells and the second set of memory cells comprises fewer memory cells or memory capacity than those of the first set of memory cells and those of the second set of memory cells.

Further examples may also comprise further sets of memory cells being serviced by the same cache memory. That is, further examples can optionally also comprise a third set of memory cells operating in direct access mode or in refresh mode as well as a fourth set of memory cells configured to operate in direct access mode or in refresh mode, while the four sets or memory cells are using the same cache memory. Principally, an arbitrary number of sets of memory cells may be serviced by a single cache memory.

Although the illustration of FIGS. 1 and 2 show separate arrays of memory cells for the first set of memory cells and the second set of memory cells, further implementations may use other architectures. For example, the first set of memory cells and the second set of memory cells may be implemented within a single array of memory cells. In this event, the first set of memory cells and the second set of memory cells are distinguished by means of the address of the memory cells. In other words, the first set of memory cells and the second set of memory cells are logically distinguished while being implemented in the same semiconductor array of memory cells.

Figure 4:
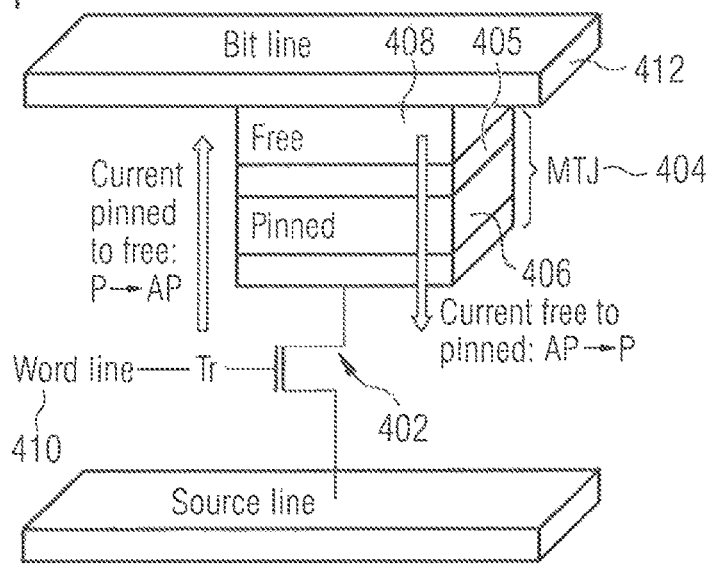
FIG. 4 illustrates an example of a magnetic random access memory cell.

According to some examples, MRAM memory cells are used as a memory type to constitute the memory for the first set of memory cells and the second set of memory cells. An example for a memory cell of magneto-resistive random-access memory is illustrated in FIG. 4. MRAM memory cells can be implemented using only few elements as illustrated by means of the example of FIG. 4 and, therefore, using only small semiconductor area. A single MRAM cell may comprise a transistor 402 and a magnetic tunnel junction 404 (MTJ), giving such a cell the name 1T-1MTJ-cell. The MTJ 404 comprises two ferromagnetic layers, a fixed layer 406 and a free layer 408 with an intermediate insulator. While the polarity of the fixed layer 406 is set to a predetermined direction, the polarity of the free layer 408 can be altered in order to be parallel or antiparallel to the polarity of the fixed layer 406. Due to the magnetic tunnel effect, the electrical resistance of the MTJ 404 changes depending on the relative orientation of the polarity between the fixed layer 406 and the free layer 408. Measuring the resistance of the MTJ 404 provides information about the relative orientation and hence about two logical states that can be stored by means of an MTJ 404. The simplest way to read out the content of an MTJ 404 is to determine its resistance. To this end, a transistor 402 may be used, whose gate is coupled to a word line 410 of a memory array built from memory cells as illustrated in FIG. 4. The bit line may be constituted by a conductor directly connected to the free layer 408 allowing to address a single MTJ 404 by means of the joint use of the word line 410 and the bit line 412.

The polarization of the free layer 408 may principally be altered by means of a magnetic field created at the junction and within the free layer 408. Switching the polarization may also be achieved by spin transfer torque (STT) using polarized electrons, which transfer their polarization directly to the ferromagnetic domains within the free magnetic layer. Using spin transfer torque switching requires less power than the power used to provide an electromagnetic field of adequate strength. Some examples use STT-MRAM-cells as the memory type used to provide the first set of memory cells and the second set of memory cells to decrease the energy consumption.

The retention time of an MRAM cell depends on the polarization of the free magnetic layer which has a limited lifetime which in turn is strongly dependent on temperature. At a high temperature, the ferromagnetic domains will, for example, disorganize faster than at low temperatures. At the same time, the amount of polarization within the free layer 408 depends on the amount of energy used to polarize the free layer 408. At a high energy and, consequently, a high initial polarization, the retention times can be made long. This comes at the cost of increased energy used to program the memory cells and, assuming that the current that can be used at write operations is limited, at higher write times. Reducing the initial polarization consequently reduces the required power and write time, at the cost of a reduced retention time of the individual cell. In other words, MRAM may be used either as a non-volatile memory or as a volatile memory. The lower switch energy it receives, the shorter its retention time becomes. This feature makes MRAM a suitable candidate for multiple implementations, since the power consumption of the MRAM cells, which is essentially given by the required amount of energy for polarization and a resultant retention time can be tailored to the particular needs in a wide range.

Within an example of a memory circuit, MRAM memory cells may qualify to replace static RAM (SRAM) cells for some applications. While SRAM cells have an intrinsically fast write speed, the leakage of an SRAM cell, i.e. the current required to maintain the content within a memory cell, is comparatively high. In order to achieve a comparable speed to SRAM, MRAM retention times need to be shortened in order to decrease the amount of energy and hence the time required to polarize the MRAM cells. This, in turn, reduces retention time. However, a decrease of retention time is compensated within the memory circuit according to the examples described herein by means of the use of a redundant set of memory cells and the associated controller. In terms of energy consumption, the energy required to maintain the stored content within the MRAM cells may be characterized by the ratio of the refreshing power required for a refresh divided by the retention time of the MRAM cell. This definition so defines an average power consumption required to maintain the stored content in an MRAM cell, similar to the leakage defined for SRAM cells. Reducing retention time, hence, increases the equivalent leakage. However, as the subsequent technology comparison will show, examples of memory circuits using MRAM cells as described herein may achieve both, comparable access times at a significantly reduced leakage as compared to SRAM cells. Furthermore, the area consumption of the memory circuits described herein may even be lower than the area consumed by a comparable array of SRAM cells, due to the reduced area of the single MRAM cell as compared to a single SRAM cell.

The following considerations will show that comparable performance to SRAM arrays may be achieved while providing some additional advantages over those based on a realistic setup for a cache memory within a CPU or the like. At presently-available technology nodes, MRAM cells can be implemented with the following parameters. At a retention time of roughly 5 ms, a switch current of about 125-133 μA is required for a write time of about 3-3.2 ns. Write times of around 3 to 4 ns, in turn, allow to replace SRAM in some applications. Having a minimum write time of 3-3.2 ns, one may define the write speed or write time during direct access mode to be 4.0 ns, while the faster write speed during the update period may be defined to be 3.5 ns. Both of the defined write times are longer than the minimum required write time of 3.2 ns so that the required retention time for the individual cells will be achieved. Further assuming that the first and second set of memory cells are arranged in equal arrays of 1024×64 M8 results in 128 word lines (WLs) and in 512 bit lines (BLs) with MUX=8 and a number of IO lines being 64. If refresh is performed row-wise, refresh for a single row (as addressed by the word lines) requires 3.5 ns×8. This results in a total refresh time for a set of memory cells of 128×8×3.5 ns=3.584 μs at the defined retention time of 5 ms. As a result, 3.584 μs are required within an interval of 5 ms in order to reproduce the content within the sets of memory cells in order to avoid data loss due to the limited retention time. As elaborated on previously, the refresh mode does not only require a reproduction period but also an updating period in order to maintain the synchronization between the two sets of memory cells.

The requirement that the number of I/O operations within the overall time required for a refresh mode (3.584 μs required for reproducing the already stored content+unknown time t required for updating) needs to be equal under direct access conditions (at write speed of 4 ns) and within the updating period (time interval t at write speed of 3.5 ns) results in the following equation:

$$\frac{3{,}584\ \mu s + t}{4\ ns} = \frac{t}{3.5\ ns}.$$

Solving the equation results in the length of the updating period of t=25.088 μs for this particular example. That is, the overall time required for a single refresh mode cycle equals 25.088 μs+3.584 μs=28.672 μs.

In summary 28.672 μs need to be used for refresh mode every 5 ms per set of memory cells in this example, achieving conditions comparable to the required write and read access speeds of some applications presently relying on SRAM memory cells. Further, this means that the cache memory only has to be active 2×28.672 μs every 5 ms. That is, a duty cycle of the cache memory is roughly 0.011, which enables the use of a single cache memory for multiple sets of memory cells, provided that the cache memory is of the same size as a single set of memory cells. Alternatively, the cache memory may contain fewer memory cells than the sets of memory cells by the amount given by a ratio given by the duty cycle.

A memory circuit of an example described herein using STT MRAM cells may be implemented at lower area consumption than a static RAM array of the same size, mainly due to the reduced size of the single 1T 1MTJ cell. To this end, a memory circuit capable of storing the same amount of data may be provided between 20% and 50% denser as compared to SRAM. Further, the overall write power required to achieve the access characteristics indicated above may be reduced by up to 20% as compared to SRAM, enabling more efficient implementations using smaller power supplies. As compared to a conventional SRAM implementation, the standby power may be reduced between 10 to 15 times.

Those facts make a memory circuit using STT MRAM cells particularly attractive for mobile communication applications or mobile applications, which benefit significantly from a reduced power consumption in terms of increased standby or operation times of battery-powered devices. Since the switch current required for a single MTJ reduces when the cell size reduces, the equivalent leakage of an STT MRAM is further expected to roughly remain constant for future technology nodes, i.e. when the structure sizes decrease further. This is due to the fact that the decreased retention time of smaller structures is compensated by the reduced refreshing power required for the cell of that size. SRAM cells, however, exhibit a higher leakage for every coming technology node. That is, the advantage of MRAM cells with respect to power consumption is expected to increase for the future technology nodes to come. Examples of memory circuits as disclosed herein may furthermore be implemented without any architectural change, since those may be addressed by conventional addressing schemes, as shown above.

The above characteristics make memory circuits according the examples described herein suited for mobile applications where power and cost are some of the priorities. For example, particularly memory-hungry applications, such as modems with 2G/3G/LTE support have those demands and suffer a lot from high leakage, resulting in low standby times of the mobile devices incorporating such modems. Further, examples of memory circuits may be used as replacement of conventional memory techniques within any processor or device using or addressing memory, for example as a cache memory within the processor's architecture or as a memory to store temporary data. Memory circuits may, for example, be incorporated into individual processors, system on chips or modem circuits for telecommunication devices.

An example for a system on a chip (SOC) using an example of a memory circuit as described above is schematically illustrated in FIG. 5.

Figure 5:
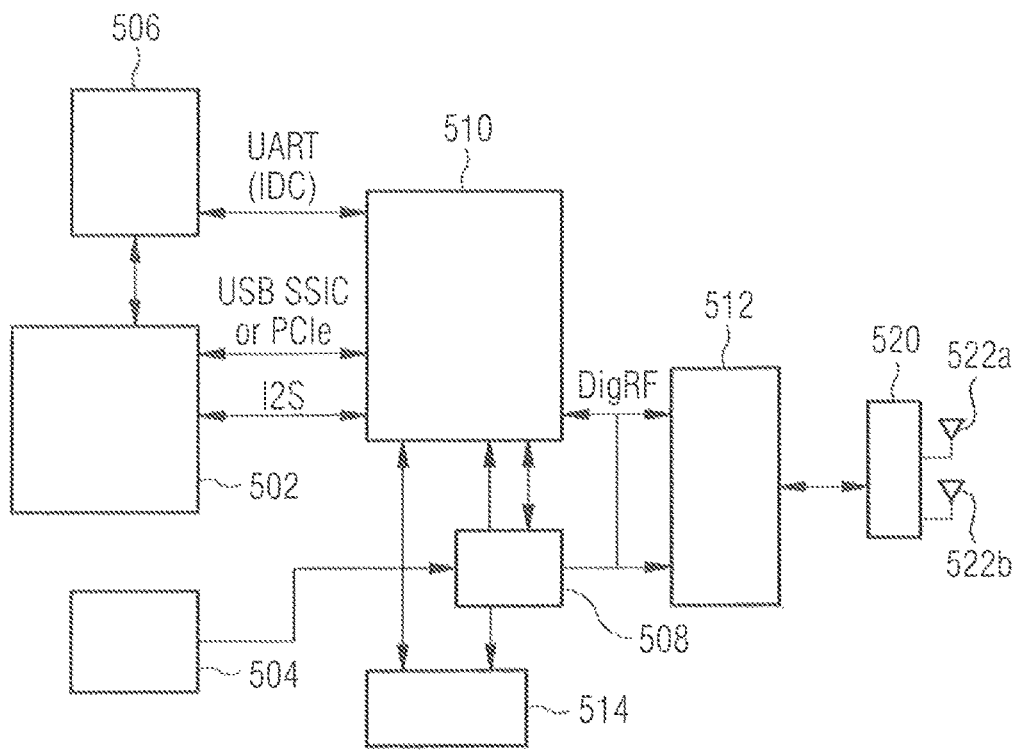
FIG. 5 illustrates an example for an architecture of a System on a Chip.

A system on a chip incorporates all components required to execute application programs and to communicate with the outside by means of different communication technologies. As a non-limiting example, FIG. 5 schematically illustrates a possible SoC architecture. The system on a chip of FIG. 5 comprises an application processor 502, a battery 504, a connectivity module 506, a power management unit 508, a modem 510 (Modulator-Demodulator), a radio frequency module 512, and a universal SIM-module 514. The application processor 502 is used to run user applications. The application processor 502 is connected to the connectivity module 506 and the modem 510 in order to communicate with external applications by means of the different communication channels provided by the SoC. For example, the connectivity module 506 may be capable of establishing and maintaining a wireless connection according to the Wifi protocol or according to the Bluetooth protocol.

The modem 510 is connected to the radio frequency module 512 which is used to receive and send data from and to a mobile communications network, such as for example a 2G/3G or LTE network or the like. The modulation and demodulation of the data exchanged with the radio frequency communication network is performed by means of the modulator 510. The radio frequency module 512 is connected to a radio frequency front end 520 used to couple the radio frequency module 512 to send and receive antennas 522a and 522b. The radio frequency module 512 and the send and receive antennas 522a and 522b are not part of the SoC and illustrated for the sake of completeness only.

The universal SIM module 514 may be used to identify the user of the SoC within the mobile telecommunications network in order to enable the network to decide whether the user is entitled to use the services of the network or not. The battery 504 is used to power the devices within the SoC, while the power management unit 508 performs the power management, for example to enable sleep states or energy-saving modes whenever appropriate.

The schematic illustration of a system on a chip of FIG. 5 is just an example of an implementation of a SoC. In further implementations, other functionalities may additionally be implemented, such as for example global positioning services, or the like. Further examples may also have less functionality than the functionality briefly described together with the example of FIG. 5.

Memory circuits as described herein may in principle be used for every component or within every component of the SOC of FIG. 5. For example, the Modulation and Demodulation may require a significant amount of memory and an example of a memory circuit can be used within modem 510, reducing the power consumption of the modem significantly as compared to a Modem implementation using SRAM cells. Further, the area used by the memory circuit may also be decreased when a memory circuit as disclosed herein is used within modem 510. Very much for the same reasons, the application processor 502 may also use a memory circuit as disclosed herein in order to decrease the energy consumption of the memory required to perform and execute the application programs. Further, not only the modem 510 used to communicate with mobile communications network may use a memory circuit as an internal memory but also modems within the connectivity module 506, for example modems used to communicate via Bluetooth or Wifi connections.

The communication technologies named previously are just examples for communication protocols using modems or other hardware comprising a memory circuit according to an example described herein. Further examples of communication protocols may correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc.

Systems on Chips incorporating an example of a memory circuit may be used within mobile devices or mobile telecommunication devices, such as for example a mobile handset capable of communicating with a mobile communication network. The mobile communication system itself may comprise a plurality of transmission points or base station transceivers operable to communicate radio signals with a mobile transceiver. In some examples, the mobile communication system may comprise mobile transceivers, relay station transceivers and base station transceivers. The relay station transceivers and base station transceivers can be composed of one or more central units and one or more remote units. Apart from the mobile device, also other components of the mobile communication system may use Modems comprising an example of a memory circuit, such as for example the Modems within relay station transceivers, base station transceivers or mobile base station transceivers.

A mobile device using an example of a memory circuit may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile device may also be referred to as UE or user in line with the 3GPP terminology.

A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

Figure 6:
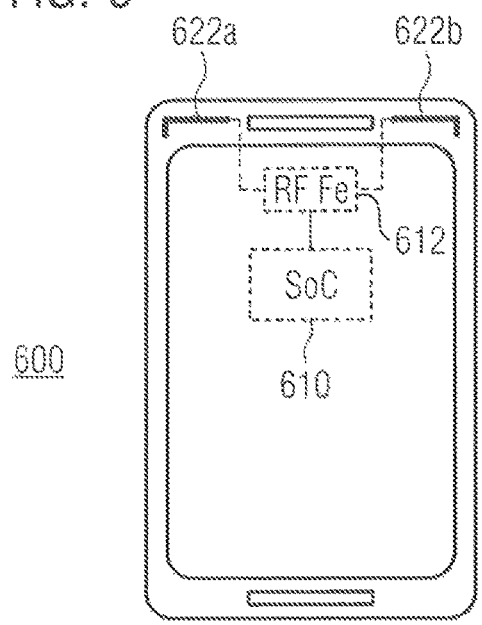
FIG. 6 illustrates an example of a mobile telecommunications device.

FIG. 6 schematically illustrates a mobile handset 600 as an example for a mobile telecommunications device using a SoC as described previously. The mobile handset comprises a SoC 610 providing for the communication capabilities. The SoC 610 is coupled to a Radio Frequency Frontend 612 used to transfer radio frequency signals generated using SoC 610 to antennas 622a and 622b. In using an SoC according to an example or in using memory circuits elsewhere within the mobile handset 600, standby and operating times of the mobile handset 600 may be increased due to the decreased energy consumption of the examples of memory circuits described herein.

FIG. 7 illustrates a flowchart of an example of a method for operating a first set of memory cells and a second set of memory cells. The method comprises operating the first set of memory cells 702 in a direct access mode or in a refresh mode. The method further comprises operating the second set of memory 704 cells in the direct access mode or in the refresh mode 704. Further, the method comprises receiving an access request 706. Depending on whether it is a read request or a write request, different access schemes are used. If a query 708 determines that it is a write request, the method comprises executing the write request 710 for a set of memory cells being in direct access mode, while buffering the write request 712 for later execution for a set of memory cells being in refresh mode. If it is, instead, determined that it is a read request, the read request is executed using the set of cells in direct access mode in 714.

The aspects and features mentioned and described together with one or more of the previously detailed examples and figures, may as well be combined with one or more of the other examples in order to replace a like feature of the other example or in order to additionally introduce the feature to the other example. The method may be performed using arbitrary hardware implementations and software implementations.

Example 1 is a memory circuit, comprising a first set of memory cells configured to operate in a direct access mode or in a refresh mode; a second set of memory cells configured to operate in the direct access mode or in the refresh mode; a controller configured to receive a write request and to execute the write request for a set of memory cells being in direct access mode; and to buffer the write request for later execution for a set of memory cells being in refresh mode.

In Example 2, in the memory circuit of example 1, the first set of memory cells is configured to only operate in refresh mode when the second set of memory cells operates in direct access mode and the second set of memory cells is configured to only operate in refresh mode when the first set of memory cells operates in direct access mode.

In Example 3, in the memory circuit of example 1 or 2, the first set of memory cells and the second set of memory cells are of the same memory type.

In Example 4, in the memory circuit of example 3, the first set of memory cells and the second set of memory cells comprise magnetic random access memory (MRAM) cells.

In Example 5, in the memory circuit of example 4, the magnetic random access memory comprises a spin-transfer torque magnetic random access memory (STT-MRAM).

In Example 6, in the memory circuit of any of the preceding examples, the controller is configured to execute the buffered write request in an updating period within a time interval used for the refresh mode.

In Example 7, in the memory circuit of example 6, the updating period is at the end of the time interval used for the refresh mode.

In Example 8, in the memory circuit of example 6, the controller is configured to execute a write request at a first write speed for a memory cell being in direct access mode and at a second write speed for a buffered write request of a memory cell being in refresh mode, the first write speed being slower than the second write speed.

In Example 9, in the memory circuit of any of the preceding examples, the controller comprises a cache memory configured to store the write requests for the first set of memory cells and for the second set of memory cells.

In Example 10, in the memory circuit of example 9, the cache memory is configured to simultaneously perform read and write operations.

In Example 11, in the memory circuit of example 9 or 10, the cache memory comprises TPRF memory cells.

In Example 12, in the memory circuit of examples 9 to 11, the cache memory comprises fewer memory capacity than that of the first set of memory cells and than that of the second set of memory cells.

In Example 13, the memory circuit of any of examples 9 to 12, optionally further comprises a third set of memory cells configured to operate in a direct access mode and in a refresh mode; and a fourth set of memory cells configured to operate in the direct access mode or in the refresh mode.

In Example 14, in the memory circuit of any of the preceding examples, the first set of memory cells comprises a first array of memory cells and the second set comprises a separate second array of memory cells.

Example 15 is a processor coupled to a memory circuit according to any of the preceding examples coupled such that the processor is capable to write data to the memory circuit.

In Example 16, in the processor of example 15, the memory circuit is used as a cache memory of the processor.

Example 17 is a System on a Chip comprising a memory circuit according to any of examples 1 to 14.

In Example 18, in the System on a chip of example 17, the memory circuit is included within a modem of the system on a chip.

Example 19 is a modem circuit for a telecommunications device comprising a memory circuit according to any of examples 1 to 14.

Example 20 is a mobile communications device comprising a system on a chip according to example 17 or 18.

Example 21 is a method for operating a first set of memory cells and a second set of memory cells, the method comprising: operating the first set of memory cells in a direct access mode or in a refresh mode; operating the second set of memory cells in the direct access mode or in the refresh mode; receiving a write request; executing the write request for a set of memory cells being in direct access mode; and buffering the write request for later execution for a set of memory cells being in refresh mode.

In Example 22, in the method according to example 21, the first set of memory cells only operates in refresh mode when the second set of memory cells operates in direct access mode; and the second set of memory cells only operates in refresh mode when the first set of memory cells operates in direct access mode.

In Example 23, the method according to example 21 or 22, further optionally comprises executing the buffered write request for the set of memory cells being in refresh mode in an updating period within a time interval used refresh mode.

In Example 24, in the method according to example 23, the updating period is at the end of the time period used for refresh mode.

In Example 25, the method according to examples 23 or 24 optionally further comprises executing the write request for a memory cell being in direct access mode at a first write speed; executing the buffered write request for a memory cell being in refresh mode at a second write speed, the first write speed being slower than the second write speed.

In Example 26, the method according to any of examples 21 to 25, optionally further comprises reading a content of the memory cells operated in the refresh mode; and writing back the readout content to the memory cells operated in refresh mode.

Example 27 is a computer program having a program code for performing the method of any of examples 21 to 26, when the computer program is executed on a computer or processor.

Example 28 is a computer readable storage medium having stored thereon a program having a program code for performing the method of any of examples 21 to 26, when the computer program is executed on a computer or processor.

Example 29 is means for operating a first set of memory cells and a second set of memory cells, comprising means for operating the first set of memory cells in a direct access mode or in a refresh mode; means for operating the second set of memory cells in the direct access mode or in the refresh mode; means for receiving a write request; means for executing the write request for a set of memory cells being in direct access mode; and means for buffering the write request for later execution for a set of memory cells being in refresh mode.

In Example 30, the means according to example 29, optionally further comprises means for executing the write request for a memory cell being in direct access mode at a first write speed; and means for executing the buffered write request for a memory cell being in refresh mode at a second write speed, the first write speed being slower than the second write speed.

In Example 31, the means according to example 29 or 30, optionally further comprise means for reading a content of the memory cells operated in the refresh mode; and means for writing back the readout content to the memory cells operated in refresh mode.

Examples may further be a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A memory circuit, comprising:
   a first set of memory cells configured to operate in a direct access mode or in a refresh mode;
   a second set of memory cells configured to operate in the direct access mode or in the refresh mode;
   a controller configured to receive a write request and to;
   execute the write request for a set of memory cells being in the direct access mode; and
   buffer the write request for later execution for a set of memory cells being in the refresh mode;
   wherein the controller is configured to execute a write request at a first write speed for a memory cell being in the direct access mode and at a second write speed for a buffered write request of a memory cell being in the refresh mode, the first write speed being slower than the second write speed.

2. The memory circuit of claim 1, wherein the first set of memory cells is configured to only operate in the refresh mode when the second set of memory cells operates in the direct access mode and the second set of memory cells is configured to only operate in the refresh mode when the first set of memory cells operates in the direct access mode.

3. The memory circuit of claim 1, wherein the first set of memory cells and the second set of memory cells are of the same memory type.

4. The memory circuit of claim 3, wherein the first set of memory cells and the second set of memory cells comprise magnetic random-access memory cells.

5. The memory circuit of claim 4, wherein the magnetic random-access memory comprises a spin-transfer torque magnetic random-access memory.

6. The memory circuit of claim 1, wherein the controller is configured to execute the buffered write request in an updating period within a time interval used for the refresh mode.

7. The memory circuit of claim 6, wherein the updating period is at the end of the time interval used for the refresh mode.

8. The memory circuit of claim 1, wherein the controller comprises a cache memory configured to store the write requests for the first set of memory cells and for the second set of memory cells.

9. The memory circuit of claim 8, wherein the cache memory is configured to simultaneously perform read and write operations.

10. The memory circuit of claim 8, wherein the cache memory comprises Two-Port Register File (TPRF) memory cells.

11. The memory circuit of claim 8, wherein the cache memory comprises fewer memory cells than the first set of memory cells and the second set of memory cells.

12. The memory circuit of claim 8, further comprising:
    a third set of memory cells configured to operate in a direct access mode and in a refresh mode; and
    a fourth set of memory cells configured to operate in the direct access mode or in the refresh mode.

13. The memory circuit of claim 1, wherein the first set of memory cells comprises a first array of memory cells and the second set of memory cells comprises a separate second array of memory cells.

14. A processor coupled to a memory circuit according to a claim 1 such that the processor is capable to write data to the memory circuit.

15. The processor of claim 14, wherein the memory circuit is configured as a cache memory of the processor.

16. A modem circuit for a telecommunications device comprising a memory circuit according to claim 1.

17. A method for operating a first set of memory cells and a second set of memory cells, the method comprising:
    operating the first set of memory cells in a direct access mode or in a refresh mode;
    operating the second set of memory cells in the direct access mode or in the refresh mode;

receiving a write request;

executing the write request for a set of memory cells being in the direct access mode; and buffering the write request for later execution for a set of memory cells being in the refresh mode;

wherein the write request for the set of memory cells in the direct access mode is executed at a slower speed than the buffered write request for the set of memory cells in the refresh mode.

18. The method according to claim 17, wherein the first set of memory cells only operates in the refresh mode when the second set of memory cells operates in the direct access mode and the second set of memory cells only operates in the refresh mode when the first set of memory cells operates in the direct access mode.

19. The method according to claim 17, further comprising:

executing the buffered write request for the set of memory cells being in the refresh mode in an updating period within a time interval used refresh mode.

* * * * *